United States Patent
Kwak (10) Patent No.: US 6,643,215 B2
(45) Date of Patent: Nov. 4, 2003

(54) SYNCHRONOUS MEMORY DEVICES WITH SYNCHRONIZED LATENCY CONTROL CIRCUITS AND METHODS OF OPERATING SAME

(75) Inventor: Jin-seok Kwak, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/025,703

(22) Filed: Dec. 19, 2001

(65) Prior Publication Data

US 2002/0093871 A1 Jul. 18, 2002

(30) Foreign Application Priority Data

Jan. 16, 2001 (KR) .......................................... 2001-2376

(51) Int. Cl.[7] ................................................ G11C 8/00
(52) U.S. Cl. .................... 365/233; 365/233.5; 365/194; 365/189.05; 365/230.08
(58) Field of Search .............................. 365/233, 233.5, 365/194, 189.05, 230.08

(56) References Cited

U.S. PATENT DOCUMENTS

| | | | | |
|---|---|---|---|---|
| 5,703,829 A | * | 12/1997 | Suzuki et al. | ................ 365/233 |
| 5,966,343 A | * | 10/1999 | Thurston | ..................... 365/233 |
| 6,125,064 A | | 9/2000 | Kim et al. | |
| 6,205,062 B1 | * | 3/2001 | Kim et al. | ................... 365/193 |
| 6,215,726 B1 | * | 4/2001 | Kubo | .......................... 365/233 |
| 6,385,709 B2 | * | 5/2002 | Merritt | ........................ 711/167 |

* cited by examiner

Primary Examiner—Richard Elms
Assistant Examiner—Tuan T. Nguyen
(74) Attorney, Agent, or Firm—Myers Bigel Sibley & Sajovec (57) ABSTRACT

A first clock signal is processed to produce a second clock signal that lags the first clock signal by a first predetermined time and a third clock signal that leads the first clock signal by a second predetermined time. A synchronous read status signal generator circuit receives a read initiation signal indicative of initiation of a read operation and a read termination signal indicative of termination of the read operation. The synchronous read status signal generator circuit produces a transition in a read status signal in response to assertion of either of the read initiation signal or the read termination signal, and latches the read status signal responsive to the second clock signal to generate a synchronized read status signal. A latency signal generator circuit receives the synchronized read status signal and generates a latency control signal therefrom responsive to the third clock signal. Output of data from the memory device is controlled responsive to the latency control signal.

38 Claims, 5 Drawing Sheets

SYNCHRONOUS MEMORY DEVICES WITH SYNCHRONIZED LATENCY CONTROL CIRCUITS AND METHODS OF OPERATING SAME

RELATED APPLICATION

This application claims priority to Korean Application No. 2001-2376, filed Jan. 16, 2001, the disclosure of which is hereby incorporated herein by reference.

BACKGROUND OF THE INVENTION

Synchronous memory devices have been recently developed in order to realize high speed operation. In a typical synchronous memory device, command signals are input in synchronization with an external clock (a "system clock"), and output data is produced in synchronization with edges of the system clock. In a typical synchronous memory device, data stored in a memory cell array is typically read in synchronization with an internal clock generated by an internal clock generator. The read data is typically output using an output control clock generated by a delay locked loop circuit. In particular, the internal clock generator typically generates the internal clock responsive to the system clock, and the delay locked loop circuit typically generates the output control clock in response to the system clock.

A typical synchronous memory device includes a latency control circuit that generates a latency control signal that controls latency, i.e., a delay between reading of data and appearance of the data at the output of an output buffer. The output buffer typically outputs data read from a memory cell array in response to an output control signal generated responsive to the latency control signal. In some conventional memory devices, latency can be correctly controlled only when timing between the read data that is synchronized with the internal clock and the output control clock is correctly controlled. For example, a column address strobe (CAS) latency means the number of clock cycles of a system clock from the time at which an external read command signal is applied to the time at which valid data is output from the synchronous memory device.

Figure 1:
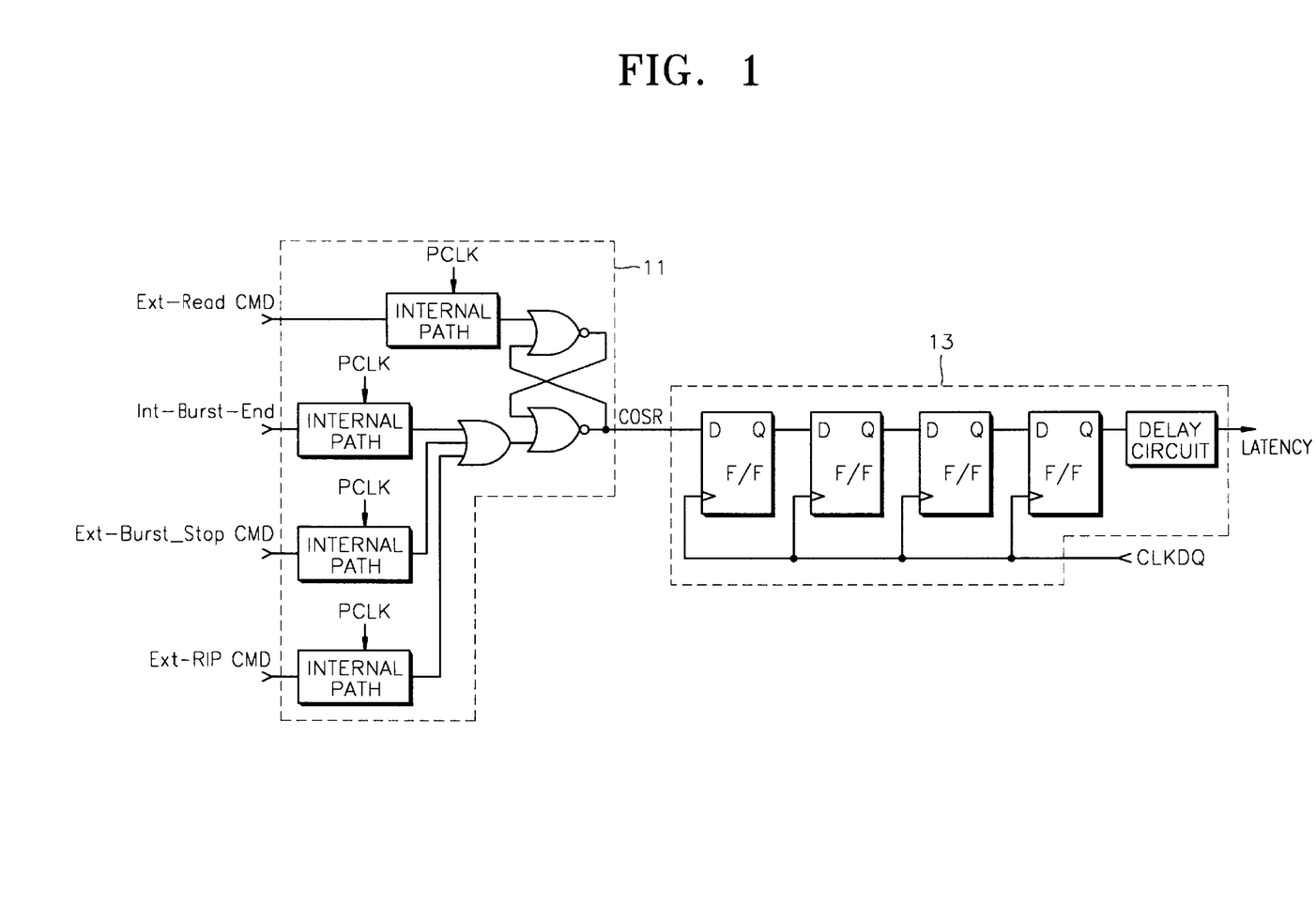
FIG. 1 is a schematic diagram illustrating a conventional latency control circuit of a conventional synchronous memory device.
Figure 2:
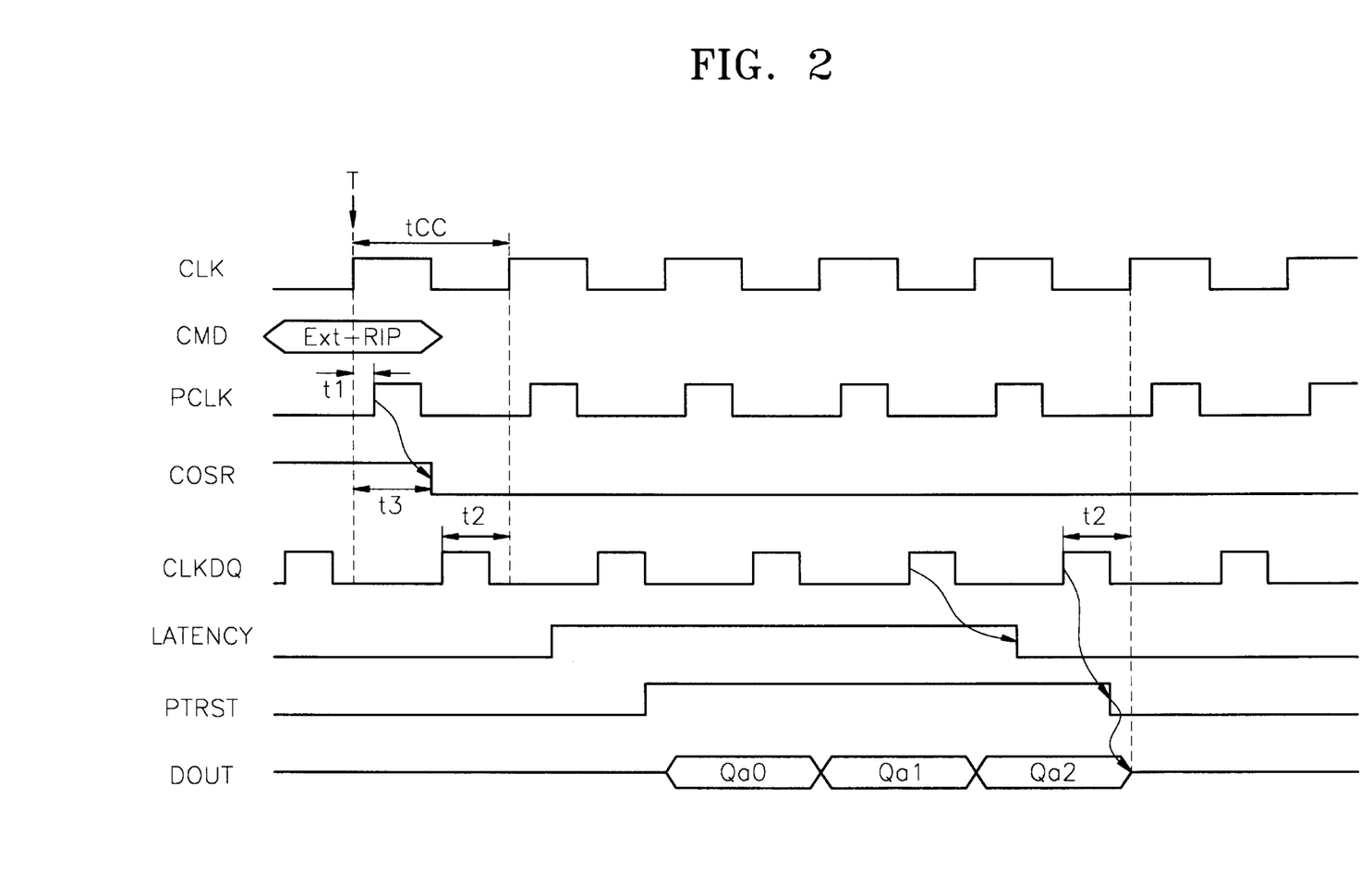
FIG. 2 is a timing diagram illustrating operations of the conventional synchronous memory device of FIG. 1.

FIG. 1 is a circuit diagram showing a latency control circuit of a conventional synchronous semiconductor memory device, while FIG. 2 is a timing diagram showing a conventional latency control technique for the conventional synchronous memory device shown in FIG. 1, in particular, a technique that provides a CAS latency of 5 and a burst length (BL) of 4. Referring to FIG. 1, the conventional latency control circuit includes a portion 11 for generating a read status signal COSR and a portion 13 for generating the latency control signal LATENCY by delaying the read status signal COSR. The portion 11 is controlled by an internal clock PCLK generated by an internal clock generator of the synchronous memory device. The read status signal COSR is asserted to a logic "high" level when an external read command signal Ext-Read CMD is applied and is asserted to a logic "low" level in response to assertion of at least one of an internal burst end signal Int-Burst-End, a burst stop command signal Ext-burst-Stop CMD or a read interrupt precharge command signal Ext-RIP CMD. The portion 13 is controlled by an output control clock CLKDQ generated by a delay locked loop circuit. The portion 13 samples the read status signal COSR and transfers data through a series of flip-flops under control of the output control clock CLKDQ.

As shown, for a CAS latency of 5, the portion 13 delays the read status signal COSR by four clock cycles of the output control clock CLKDQ. As shown in the timing diagram of FIG. 2, the internal clock PCLK lags the externally applied system clock CLK by a predetermined time t1, while the output control clock CLKDQ leads the system clock CLK by a predetermined time t2. Though not shown in the timing diagram of FIG. 2, when a read command signal Ext-Read CMD is asserted during a cycle of the system clock CLK, the read status signal COSR is asserted to a logic "high" level after a predetermined delay following assertion of the read command signal Ext-Read CMD, due to the delay of the internal paths of the portion 11. Also, as shown in the timing diagram of FIG. 2, when the read interrupt precharge command signal Ext-RIP is asserted after three cycles (i.e., around a time T) of the system clock CLK following assertion of the read command signal Ext-Read CMD, the read status signal COSR is asserted to a logic "low" following a delay time t3 from time T due to the delay of the internal paths of the portion 11. The read status signal COSR is sampled in the portion 13 responsive to next rising edge of the output control clock CLKDQ.

When the sum of the times t3 and t2 exceeds the period tCC of the system clock CLK, the read status signal COSR may not be correctly sampled by the portion 13, which may result in incorrect latency control that causes output data DOUT to be produced one clock cycle later than desired. Thus, for example, in the conventional latency control circuit operations illustrated, the period tCC of the system clock CLK should be constrained to be greater than the sum of times t3 and t2 to provide desired operation (e.g., if t3 is 3 nanoseconds (ns) and t2 is 3 ns, tCC should be greater than 6 ns). Limitations of the latency control circuit can thus constrain the system clock CLK period (and limit the clock frequency), even though other portions of the memory device may be capable of operating at faster clock speeds. This can limit the overall performance of the synchronous memory device.

SUMMARY OF THE INVENTION

According to some embodiments of the present invention, a synchronous memory device includes a first clock generator circuit that receives a first clock signal and generates a second clock signal therefrom, the second clock signal lagging the first clock signal by a first predetermined time. The memory device also includes a second clock generator circuit that receives the first clock signal and generates a third clock signal therefrom, the third clock signal leading the first clock signal by a second predetermined time. A synchronous read status signal generator circuit is coupled to the first clock generator circuit and receives a read initiation signal indicative of initiation of a read operation and a read termination signal indicative of termination of the read operation. The synchronous read status signal generator circuit produces a transition in a read status signal in response to assertion of either of the read initiation signal or the read termination signal, and latches the read status signal responsive to the second clock signal to generate a synchronized read status signal. A latency signal generator circuit is coupled to the second clock generator circuit and to the synchronous read status signal generator circuit, receives the synchronized read status signal, and generates a latency control signal therefrom responsive to the third clock signal. The memory device further includes a memory cell array and a data output buffer coupled to the memory cell array that receives data from the memory cell array and outputs the received data responsive to an output control signal. An output control circuit generates the output control signal responsive to the latency control signal.

In some embodiments of the present invention, the synchronous read status signal generator circuit transitions the synchronized read status signal upon a next-occurring edge of the second clock signal after transition of the read status signal. The synchronous read status signal generator circuit may, in response to transition of the read status signal during a first cycle of the first clock signal, transition the synchronized read status signal during a second cycle of the first clock signal. The first cycle of the first clock signal may immediately precede the second cycle of the first clock signal.

In some embodiments of the present invention, the synchronous read status signal generator circuit comprises a read status signal generator circuit that receives the read initiation signal and the read termination signal and responsively generates the read status signal and a synchronous delay circuit, e.g., an edge-triggered flip-flop, that generates the synchronized read status signal from the read status circuit responsive to the second clock signal. The latency signal generator circuit may include a level-triggered latch that receives the synchronized read status signal and that latches the received synchronized read status signal responsive to a level of the third clock signal.

Related operating methods for memory devices are also provided.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when elements are referred to as being coupled to one another, this coupling may be direct or via one or more intervening elements.

Figure 3:
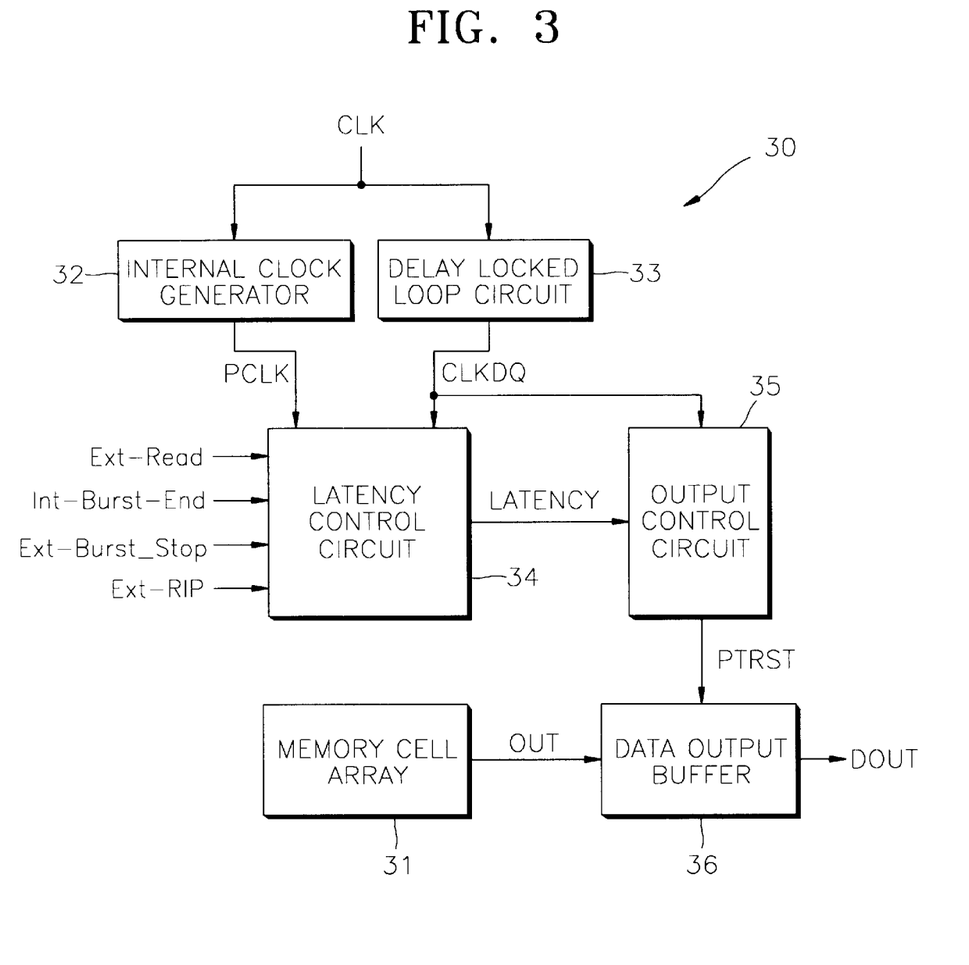
FIG. 3 is a schematic block diagram illustrating a synchronous memory device according to embodiments of the present invention.

FIG. 3 is a schematic diagram of portions of a synchronous memory device according to embodiments of the present invention, in particular, circuits related to output of data. The memory device 30 includes a memory cell array 31, an internal clock generator 32, a delay locked loop circuit 33, a latency control circuit 34, an output control circuit 35, and a data output buffer 36. The internal clock generator 32 generates an internal clock PCLK in response to an external system clock CLK. The delay locked loop circuit 33 generates an output control clock CLKDQ in response to the system clock CLK. As shown in the timing diagram shown in FIG. 5, the internal clock PCLK lags the system clock CLK by a predetermined time and the output control clock CLKDQ leads the system clock CLK by a predetermined time. In particular, a rising edge of the internal clock PCLK is generated a predetermined time t1 after a rising edge of the system clock CLK. A rising edge of the output control clock CLKDQ is generated a predetermined time t2 before a rising edge of the system clock CLK.

The latency control circuit 34 receives a signal that indicates initiation of a read operation, here shown as an external read command signal Ext-Read CMD. The latency control circuit 34 further receives signals that indicate termination of the read operation, here shown as including an internal burst end signal Int-Burst-End, an external burst stop command signal Ext-Burst-Stop CMD, and an external read interrupt precharge command signal Ext-RIP CMD. The latency control circuit 34 receives these input signals and generates a latency control signal LATENCY that controls when output data DOUT is produced from the data output buffer 36. In particular, the output control circuit 35 receives the latency control signal LATENCY and generates an output control signal PTRST by delaying the latency control signal LATENCY responsive to the output control clock CLKDQ. In response to the output control signal PTRST, the data output buffer 36 produces output data DOUT from data OUT read from the memory cell array 31.

Figure 4:
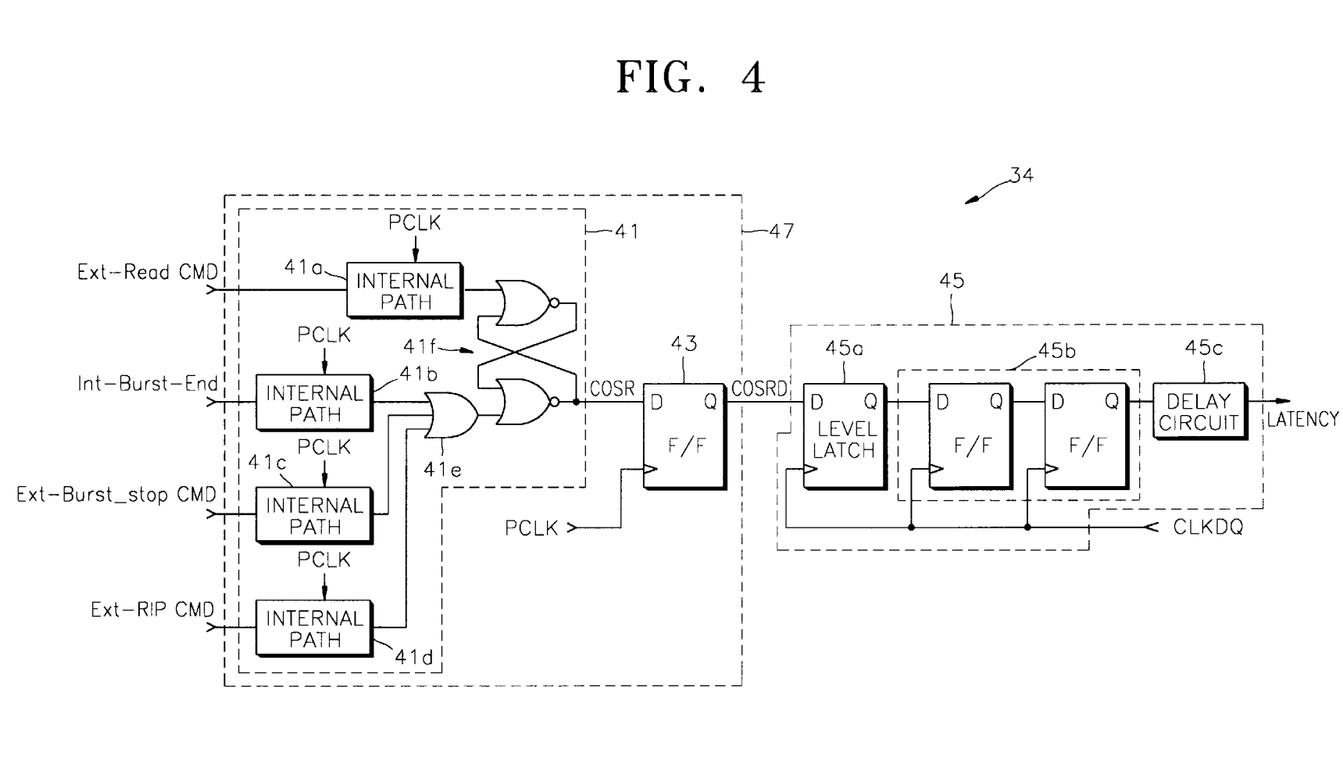
FIG. 4 is a schematic diagram illustrating a latency control circuit according to embodiments of the present invention.

FIG. 4 is a detailed circuit diagram showing a latency control circuit 34 according to embodiments of the present invention, in particular, a latency control circuit 34 providing a CAS latency of 5. The latency control circuit 34 includes a synchronous read status signal generator circuit 47 and a latency control signal generator circuit 45. The synchronous read status signal generator circuit 47 includes a read status signal generator circuit 41 that generates a read status signal COSR that is asserted to a logic "high" level in response to a signal indicating initiation of a read operation, here an external read command signal Ext-Read CMD. The read status signal COSR is asserted to a logic "low" level in response to assertion of any of a plurality of signals that are indicative of termination of a read operation, here shown as including an internal burst end signal Int-Burst-End, an external burst stop command signal Ext-Burst-Stop CMD, and a read interrupt precharge command signal Ext-RIP CMD. The read status signal generator circuit 41 includes internal paths 41a through 41d, an OR gate 41e, and a latch 41f. The internal paths 41a through 41d are controlled by the internal clock PCLK. The synchronous read status signal generator circuit 47 further includes a synchronous delay circuit, e.g., a flip-flop 43, that latches the read status signal COSR to generate a synchronized read status signal COSRD that is synchronized with the internal clock signal PCLK and that is delayed with respect to the read status signal COSR.

The latency control signal generator circuit 45 includes a level-triggered latch 45a that samples the synchronized read status signal COSRD when the output control clock signal CLKDQ is at a logic "high" level. The latency control signal generator circuit 45 further includes a first delay circuit including serially-connected edge-triggered flip-flops 45b triggered by the output control clock signal CLKDQ, and a second delay circuit 45c that outputs the latency control signal LATENCY.

Figure 5:
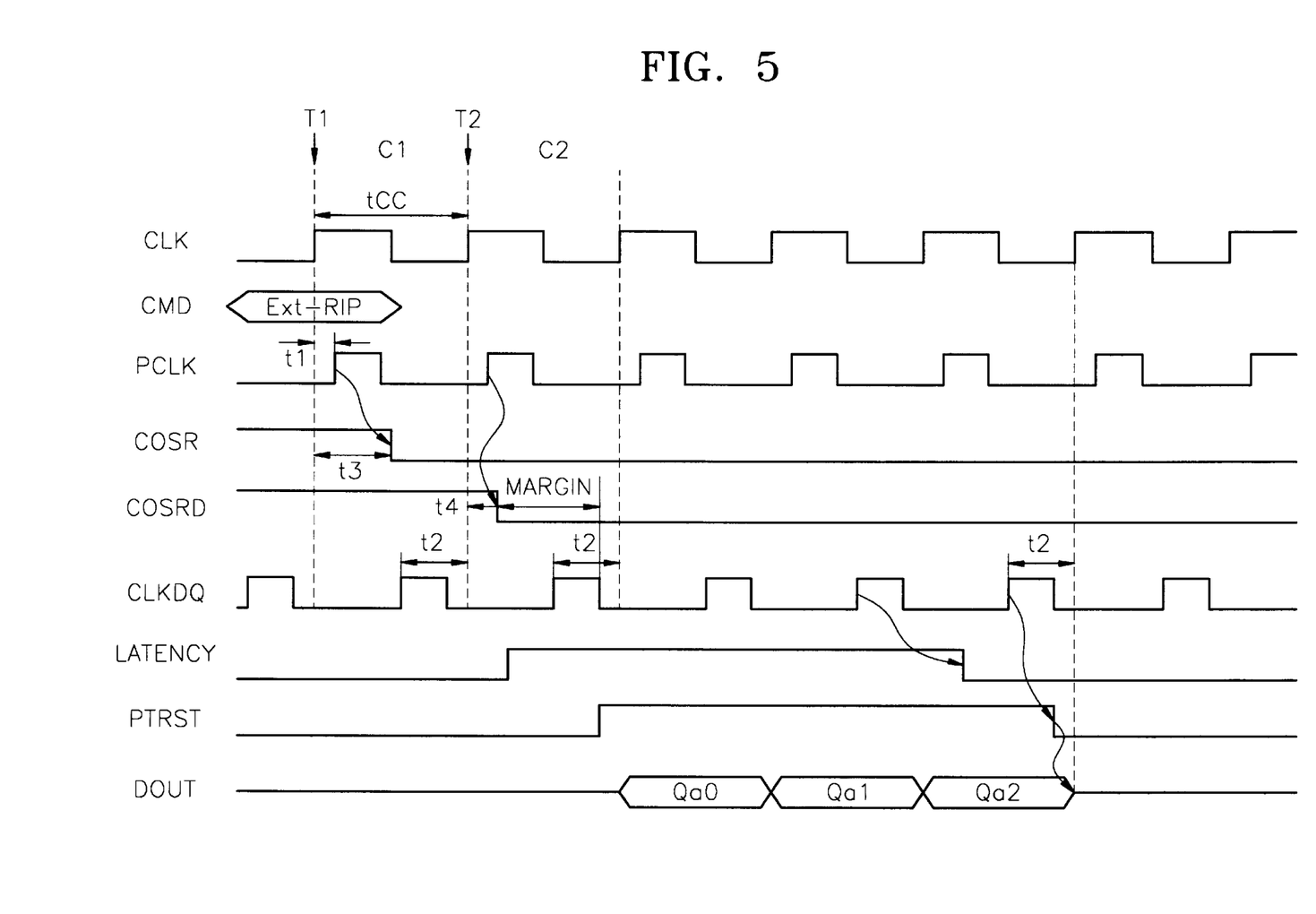
FIG. 5 is a timing diagram showing exemplary operations of a latency control circuit according to embodiments of the present invention.

Referring to the timing diagram of FIG. 5, when the external read command signal Ext-Read CMD is asserted, the read status signal COSR is driven to a logic "high" level. When the read interrupt precharge command signal Ext-RIP is subsequently asserted, the read status signal COSR is driven to a logic "low" level after a delay t3 following a rising edge of the system clock signal CLK at time T1. The synchronized read status signal COSRD is subsequently driven to a logic "low" level in response to the next rising edge of the internal clock signal PCLK. The level-triggered flip-flop 45a of the latency control signal generator circuit 45 samples the synchronized read status signal COSRD when the output control clock CLKDQ is at a logic "high" level, which can improve sampling margin in comparison to the conventional circuit illustrated in FIG. 1. The latency control signal generator circuit 45 delays the sampled signal by three clock cycles of the output control clock CLKDQ and generates the latency control signal LATENCY. The circuit shown in FIG. 4 shows a case where the CAS latency is 5. The number of flip-flops 45b may be reduced or increased to provide lesser or greater CAS latency.

Referring to FIGS. 3 and 4 in conjunction with the timing diagram of FIG. 5, a system clock signal CLK is externally applied to the memory device 30. The internal clock generator 32 produces an internal clock signal PCLK that lags the system clock CLK by a predetermined time t1. The delay locked loop circuit 33 produces an output control clock CLKDQ that leads the system clock CLK by a predetermined time t2. Responsive to assertion of the read command signal Ext-Read CMD, the read status signal COSR is asserted to a logic "high" level by the read status signal generator circuit 41. The synchronized read status signal COSRD is subsequently driven to a logic "high" level by the synchronous delay circuit 43 upon the next rising edge of the internal clock signal PCLK. Subsequently, when the read interrupt precharge command signal Ext-RIP is asserted near a time T1, the read status signal COSR is asserted to a logic "low" level by the read status signal generator circuit 41 after a delay t3 with respect to T1. The synchronized read status signal COSRD is subsequently driven to a logic "low" level upon the next rising edge of the internal clock signal PCLK, after a delay t4 following a rising edge of the system clock signal CLK at a time T2.

The synchronized read status signal COSRD is sampled by the level-triggered flip-flop 45a of the latency control signal generator circuit 45 when the output control clock signal CLKDQ is at a logic "high" level. The latency control signal LATENCY is driven to a logic "low" level after a delay of three clock cycles of the output control clock CLKDQ. The output control circuit 35 responsively drives the output control signal PTRST to a logic "low" level upon a next rising edge of the output control clock signal CLKDQ. Responsive to assertion of the output control signal PTRST to a logic "low," data DOUT from the memory cell array 31 is provided at the output of the data output buffer 36.

In a conventional synchronous memory device such as that described above with reference to FIGS. 1 and 2, such a read status signal COSR would typically be sampled during the cycle C1 of a system clock signal CLK. In contrast, in embodiments of the present invention illustrated in FIGS. 4 and 5, a synchronized read status signal COSRD may be sampled during a relatively earlier portion of a succeeding cycle C2 of the system clock signal CLK, which can provide a larger margin for the system clock signal CLK than in the aforementioned conventional memory devices. This can allow the system clock signal CLK to have a relatively higher frequency. In addition, because the synchronized read status signal COSRD may be level sampled, sampling margin in a memory device according to embodiments of the present invention may be improved.

In the drawings and specification, there have been disclosed typical embodiments of the invention and, although specific terms are employed, they are used in a generic and descriptive sense only and not for purposes of limitation, the scope of the invention being set forth in the following claims. Although the invention has been described with reference to particular embodiments, it will be apparent to one of ordinary skill in the art that modifications of the described embodiments may be made without departing from the spirit and scope of the invention.

That which is claimed is:

1. A synchronous memory device, comprising:
    a first clock generator circuit that receives a first clock signal and generates a second clock signal therefrom, the second clock signal lagging the first clock signal by a first predetermined time;
    a second clock generator circuit that receives the first clock signal and generates a third clock signal therefrom, the third clock signal leading the first clock signal by a second predetermined time;
    a synchronous read status signal generator circuit, coupled to the first clock generator circuit, that receives a read initiation signal indicative of initiation of a read operation and a read termination signal indicative of termination of the read operation, that produces a transition in a read status signal in response to assertion of either of the read initiation signal or the read termination signal, and that latches the read status signal responsive to the second clock signal to generate a synchronized read status signal;
    a latency signal generator circuit, coupled to the second clock generator circuit and to the synchronous read status signal generator circuit, that receives the synchronized read status signal and generates a latency control signal therefrom responsive to the third clock signal;
    a memory cell array;
    a data output buffer coupled to the memory cell array that receives data from the memory cell array and outputs the received data responsive to an output control signal; and
    an output control circuit that generates the output control signal responsive to the latency control signal.

2. A memory device according to claim 1, wherein the synchronous read status signal generator circuit transitions the synchronized read status signal upon a next-occurring edge of the second clock signal after transition of the read status signal.

3. A memory device according to claim 1, wherein the synchronous read status signal generator circuit, in response to transition of the read status signal during a first cycle of the first clock signal, transitions the synchronized read status signal during a second cycle of the first clock signal.

4. A memory device according to claim 3, wherein the first cycle of the first clock signal immediately precedes the second cycle of the first clock signal.

5. A memory device according to claim 1, wherein the synchronous read status signal generator circuit comprises:
    a read status signal generator circuit that receives the read initiation signal and the read termination signal and responsively generates the read status signal; and
    a synchronous delay circuit that generates the synchronized read status signal from the read status circuit responsive to the second clock signal.

6. A memory device according to claim 5, wherein the delay circuit comprises an edge-triggered flip flop.

7. A memory device according to claim 1, wherein the latency signal generator circuit comprises a level-triggered latch that receives the synchronized read status signal and that latches the received synchronized read status signal responsive to a level of the third clock signal.

8. A memory device according to claim 7, wherein the delay circuit further comprises at least one edge-triggered latch that receives the latched synchronized read status signal and that generates the latency control signal responsive to at least one edge of the third clock signal.

9. A memory device according to claim 1, wherein the read initiation signal comprises an external read command signal, and wherein the read termination signal comprises at least one of an internal burst end signal, an external burst stop command signal and an external read interrupt precharge command signal.

10. A latency control circuit for a synchronous memory device, the latency control circuit including:
   a synchronous read status signal generator circuit that receives a read initiation signal indicative of initiation of a read operation and a read termination signal indicative of termination of the read operation, that produces a transition in a read status signal in response to assertion of either of the read initiation signal or the read termination signal, and that latches the read status signal responsive to a first clock signal generated by a first lock generator circuit to generate a synchronized read status signal; and
   a latency signal generator circuit, coupled to a second clock generator circuit and to the synchronous read status signal generator circuit, that receives the synchronized read status signal and generates a latency control signal therefrom responsive to a second clock signal generated by the second clock generator circuit, wherein the first and second clock signals respectively lag and lead a system clock signal by respective first and second predetermined times.

11. A circuit according to claim 10, wherein the synchronous read status signal generator circuit transitions the synchronized read status signal upon a next-occurring edge of the first clock signal after transition of the read status signal.

12. A circuit according to claim 10, wherein the synchronous read status signal generator circuit, in response to transition of the read status signal during a first cycle of the system clock signal, transitions the synchronized read status signal during a second cycle of the system clock signal.

13. A circuit according to claim 12, wherein the first cycle of the first clock signal immediately precedes the second cycle of the first clock signal.

14. A circuit according to claim 10, wherein the synchronous read status signal generator circuit comprises:
   a read status signal generator circuit that receives the read initiation signal and the read termination signal and responsively generates the read status signal; and
   a synchronous delay circuit that generates the synchronized read status signal from the read status circuit responsive to the first clock signal.

15. A circuit according to claim 10, wherein the latency signal generator circuit comprises a level-triggered latch that receives the synchronized read status signal and that latches the received synchronized read status signal responsive to a level of the second clock signal.

16. A method of operating a synchronous memory device, the method comprising:
   generating a second clock signal that lags a first clock signal by a first predetermined time;
   generating a third clock signal that leads the first clock signal by a second predetermined time;
   producing a transition in a read status signal in response to assertion of either of a read initiation signal indicative of initiation of a read operation or a read termination signal indicative of termination of the read operation;
   latching the read status signal responsive to the second clock signal to generate a synchronized read status signal;
   generating a latency control signal from the synchronized read status signal responsive to the third clock signal;
   generating an output control signal responsive to the latency control signal; and
   outputting data from an output buffer of the memory device responsive to the output control signal.

17. A method according to claim 16, wherein latching the read status signal comprises transitioning the synchronized read status signal upon a next-occurring edge of the second clock signal after transition of the read status signal.

18. A method according to claim 16, wherein the transition of the read status signal occurs during a first cycle of the first clock signal, and wherein the transition of the synchronized read status signal occurs during a second cycle of the first clock signal.

19. A method according to claim 18, wherein the first cycle of the first clock signal immediately precedes the second cycle of the first clock signal.

20. A latency control circuit of a synchronous semiconductor memory device for generating a latency control signal for determining the point of time, at which output data is generated, comprising:
   a read status signal generator circuit for enabling a read status signal in response to a read command signal and for disabling the read status signal in response to either an internal end signal or a stop command signal;
   a delay circuit for delaying the read status signal by one cycle of a first clock in response to the first clock that lags a system clock applied from the outside of the semiconductor memory device by a first predetermined phase difference; and
   a latency control signal generator circuit for sampling the delayed read status signal during a section where a second clock is at a first logic level and generating the latency control signal by delaying the sampled signal, wherein the second clock leads the system clock by a second predetermined phase difference.

21. The latency control circuit of claim 20, wherein the internal end signal is a burst end signal generated from the inside of the synchronous semiconductor memory device.

22. The latency control circuit of claim 20, wherein the stop command signal is either a burst stop command signal applied from the outside of the synchronous semiconductor memory device or a read interrupt precharge command signal.

23. The latency control circuit of claim 20, wherein the latency control signal generator circuit comprises:
   a latch for sampling the delayed read status signal during the first logic level section of the second clock;
   a first delay circuit for delaying the output signal of the latch by a predetermined number of cycles of the second clock; and
   a second delay circuit for outputting the latency control signal by delaying the output signal of the first delay circuit.

24. The latency control circuit of claim 20, wherein the first logic level is a logic "high" level.

25. A synchronous semiconductor memory device, comprising:
- a memory cell array;
- an internal clock generator for generating an internal clock in response to a system clock applied from the outside;
- a delay locked loop circuit for generating an output control clock in response to the system clock;
- a latency control circuit for generating a latency control signal for determining the point of time, at which output data is generated, in response to the output control clock;
- an output control circuit for generating an output control signal by delaying the latency control signal; and
- a data output buffer for outputting data read from the memory cell array as the output data to the outside in response to the output control signal, wherein the latency control circuit comprises:
- a read status signal generator circuit for generating a read status signal enabled in response to a read command signal applied from the outside and disabled in response to either an internal end signal or a stop command signal;
- a delay circuit for delaying the read status signal by one cycle of the internal clock in response to the internal clock; and
- a latency control signal generator circuit for sampling the delayed read status signal during the first logic level section of the output control clock and generating the latency control signal by delaying the sampled signal, in response to the output control clock.

26. The synchronous semiconductor memory device of claim 25, wherein the internal clock lags the system clock by a predetermined phase difference.

27. The synchronous semiconductor memory device of claim 25, wherein the output control clock leads the system clock by a predetermined phase difference.

28. The synchronous semiconductor memory device of claim 25, wherein the internal end signal is a burst end signal generated from the inside of the synchronous semiconductor memory device.

29. The synchronous semiconductor memory device of claim 25, wherein the stop command signal is either a burst stop command signal applied from the outside of the synchronous semiconductor memory device or a read interrupt precharge command signal.

30. The synchronous semiconductor memory device of claim 25, wherein the latency control signal generator circuit comprises:

- a latch for sampling the delayed read status signal during the first logic level section of the output control clock;
- a first delay circuit for delaying the output signal of the latch by a predetermined number of cycles of the output control clock; and
- a second delay circuit for outputting the latency control signal by delaying the output signal of the first delay circuit.

31. The semiconductor memory device of claim 25, wherein the first logic level is a logic "high" level.

32. A latency control method of a synchronous semiconductor memory device, comprising:
- generating an internal clock in response to a system clock applied from the outside;
- generating an output control clock in response to the system clock;
- generating a read status signal enabled in response to a read command signal applied from the outside and disabled in response to either an internal end signal or a stop command signal;
- delaying the read status signal by one cycle of the internal clock in response to the internal clock; and
- sampling the delayed read status signal during the first logic level section of the output control clock and generating the latency control signal by delaying the sampled signal in response to the output control signal.

33. The latency control method of claim 32, wherein the internal clock lags the system clock by a predetermined phase difference.

34. The latency control method of claim 32, wherein the output control clock leads the system clock by a predetermined phase difference.

35. The latency control method of claim 32, wherein the internal end signal is a burst end signal generated from the inside of the synchronous semiconductor memory device.

36. The latency control method of claim 32, wherein the stop command signal is either a burst stop command signal applied from the outside of the synchronous semiconductor memory device or a read interrupt precharge command signal.

37. The latency control method of claim 32, wherein the step of generating the latency control signal comprises:
- sampling the delayed read status signal during the first logic level section of the output control clock;
- delaying the sampled signal by a predetermined number of cycles of the output control clock; and
- generating the latency control signal by delaying the signal delayed by the predetermined number of cycles.

38. The method of claim 32, wherein the first logic level is a logic "high" level.

* * * * *

UNITED STATES PATENT AND TRADEMARK OFFICE
CERTIFICATE OF CORRECTION

PATENT NO.   : 6,643,215 B2
DATED        : November 4, 2003
INVENTOR(S)  : Jin-seok Kwak It is certified that error appears in the above-identified patent and that said Letters Patent is hereby corrected as shown below:

Column 7,
Line 27, change "first lock" to -- first clock --.

Signed and Sealed this

Twenty-fourth Day of February, 2004

JON W. DUDAS
*Acting Director of the United States Patent and Trademark Office*